US010090160B2

United States Patent
Mori et al.

(10) Patent No.: US 10,090,160 B2
(45) Date of Patent: Oct. 2, 2018

(54) DRY ETCHING APPARATUS AND METHOD (71) Applicant: HITACHI HIGH-TECHNOLOGIES CORPORATION, Tokyo (JP)

(72) Inventors: Masahito Mori, Kudamatsu (JP); Masaru Izawa, Kudamatsu (JP); Katsushi Yagi, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/003,706

(22) Filed: Jan. 21, 2016

(65) Prior Publication Data

US 2016/0141183 A1    May 19, 2016

Related U.S. Application Data (62) Division of application No. 13/571,018, filed on Aug. 9, 2012.

(30) Foreign Application Priority Data

Mar. 1, 2012  (JP) ................. 2012-045400

(51) Int. Cl.
*H01L 21/302*  (2006.01)
*H01L 21/461*  (2006.01)
(Continued)

(52) U.S. Cl.
CPC ........ *H01L 21/3065* (2013.01); *H01J 37/321* (2013.01); *H01J 37/32706* (2013.01); *H03H 7/40* (2013.01); *H05H 2001/4682* (2013.01)

(58) Field of Classification Search
CPC .................................................. H01L 21/32136
(Continued)

(56) References Cited

U.S. PATENT DOCUMENTS 5,997,687 A * 12/1999 Koshimizu ....... H01J 37/32082
                                                        118/723 E
6,136,388 A    10/2000 Raoux et al.
(Continued)

FOREIGN PATENT DOCUMENTS

| JP | 2005-079416 A | 3/2005 |
| JP | 2007-059567 A | 3/2007 |
| JP | 2011-082180 A | 4/2011 |

OTHER PUBLICATIONS

Non-Final Office Action U.S. Appl. No. 13/571,018 dated Feb. 27, 2014.
(Continued)

*Primary Examiner* — Thomas Pham
(74) *Attorney, Agent, or Firm* — McDermott Will & Emery LLP (57) ABSTRACT

There is provided dry etching apparatus including a stage on which a wafer is placed, an antenna electrode, a high frequency power supply, a shower plate, and an RF bias power supply. Further, a bias path controller is provided on the side of the antenna electrode. The bias path controller resonates in series with the static reactance formed by the shower plate with respect to the frequency of the RF bias. Then, the bias path controller changes and grounds the impedance by the variable inductive reactance. With this mechanism, highly uniform etching can be achieved even if a shower plate of quartz is used for corrosive gases.

3 Claims, 9 Drawing Sheets

(51) Int. Cl.
*B44C 1/22* (2006.01)
*C03C 15/00* (2006.01)
*C03C 25/68* (2006.01)
*C23F 1/00* (2006.01)
*H01L 21/3065* (2006.01)
*H01J 37/32* (2006.01)
*H03H 7/40* (2006.01)
*H05H 1/46* (2006.01)

(58) Field of Classification Search
USPC .......................................................... 216/61
See application file for complete search history.

(56) References Cited

U.S. PATENT DOCUMENTS

| | | |
|---|---|---|
| 2003/0037881 A1 | 2/2003 | Barnes et al. |
| 2006/0037704 A1 | 2/2006 | Iwata et al. |
| 2007/0044716 A1* | 3/2007 | Tetsuka ............. H01J 37/32082 |
| | | 118/723 I |
| 2008/0210376 A1 | 9/2008 | Maeda et al. |
| 2008/0277062 A1* | 11/2008 | Koshimizu ....... H01J 37/32082 |
| | | 156/345.28 |

OTHER PUBLICATIONS

Final Office Action U.S. Appl. No. 13/571,018 dated Oct. 2, 2014.
Non-Final Office Action U.S. Appl. No. 13/571,018 dated Apr. 7, 2015.
Final Office Action U.S. Appl. No. 13/571,018 dated Oct. 22, 2015.

* cited by examiner

DRY ETCHING APPARATUS AND METHOD

CLAIM OF PRIORITY

The present application is a Divisional Application of U.S. Ser. No. 13/571,018 filed Aug. 9, 2012, which claims priority from Japanese patent application JP 2012-45400 filed on Mar. 1, 2012, the content of each is hereby incorporated by reference into this application.

BACKGROUND OF THE INVENTION

1. Field of the Invention

The present invention relates to a dry etching apparatus and method for producing semiconductor devices and Micro-Electro-Mechanical-Systems (MEMS).

2. Description of the Related Art

With the recent increase in the capacity of semiconductor memories and in the speed of semiconductor devices, there is a need for fine processing technology to process silicone and a laminated film of oxide silicon, silicon nitride, and the like, to have a space width of 10 nm and an aspect ratio of 15 or more. Further, under such circumstances, there is a need for etching apparatus using a plasma source capable of generating a plasma with a medium density at low to high pressure, to maintain the throughput (mass productivity) improvement.

A parallel-plate type plasma source is suitable for such a plasma source. The parallel-plate type plasma source generates a plasma in a region between an upper electrode and a lower electrode. Further, the magnetic VHF plasma etching apparatus is known as a dry etching apparatus with a VHF wave of 200 MHz as well as a magnetic generation coil for distribution control.

The magnetic VHF plasma etching apparatus includes a vacuum chamber in which a vertically movable wafer stage (lower electrode), and an antenna electrode (upper electrode) located opposite the vertically movable stage are placed (Japanese Patent. Application laid-Open Publication No. 2005-79416). The magnetic VHF plasma etching apparatus emits VHF radiation at a frequency of 200 MHz from the antenna electrode to ionize the gas within the vacuum chamber into a plasma. At this time, a uniform ion distribution can be achieved by controlling the plasma generation distribution and the plasma diffusion by electromagnets A and B arranged so as to have magnetic field lines in the vertical direction.

The height of the plasma generated between the antenna electrode and the wafer stage on which a wafer is placed, can be changed in a range of 18 to 140 mm by a wafer stage lifting mechanism. The wafer stage includes an RF bias power supply of 4 MHz for drawing ions in order to accelerate the etching reaction, as well as a temperature controller for wafer temperature control.

The VHF plasma etching apparatus with such a configuration can generate a low-dissociation and high-pressure plasma, and is suitable for etching of silicone insulating film using fluorocarbon gas. Gases for plasma generation are introduced into the antenna electrode from a gas inlet port. The introduced gases are concentrically distributed so as not to be mixed together in a gas distribution plate. Then, the gases with different composition ratios are discharged into the vacuum chamber from a shower plate.

The shower plate for insulating film etching uses a low-resistance silicon plate with a large number of openings, in which ions are drawn to the surface of the silicon panel by a bias that an RF power supply for antenna bias oscillates, to achieve a highly-selective insulating film etching by consuming excessive fluorine. At this time, the phases of the RF power supply for antenna-bias and the RF bias power supply are controlled to be 180 degrees, respectively, by a phase control unit based on the detected phases.

There is disclosed a method for using corrosive gases such as $Cl_2$ and HBr in the apparatus described above, by splaying resin or ceramic on the surface to which a pressure of 50 Pa or more is applied between the antenna electrode and the gas distribution plate, and by using a dielectric material for the shower plate (Japanese Patent Application Laid-Open Publication No. 2007-59567).

There is also disclosed a method for providing an electrical property control circuit on the side of the upper electrode facing it, in a capacitively-coupled plasma (CCP) etching apparatus (Japanese Patent Application Laid-Open Publication No. 2011-82180).

SUMMARY OF THE INVENTION

Figure 2:
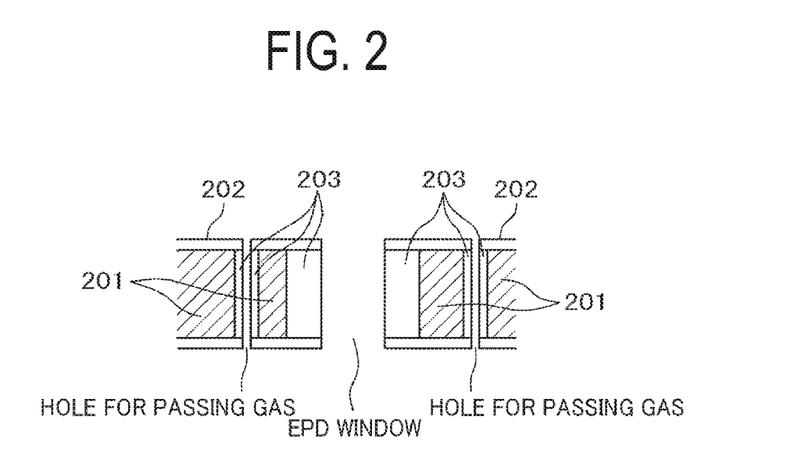
FIG. 2 is a schematic cross-sectional view around a hole for passing gas of a gas distribution plate with the SUS surface coated by polyimide and ceramic that the inventors have studied in the section of Problems.

The present inventors have tried. Si etching by magnetic VHF plasma using corrosive gases. At this time, in the magnetic VHF plasma, etching is performed by applying an bias of 4 MHz to a wafer stage, by an antenna electrode and a gas distribution plate that are configured as described in Japanese Patent Application laid-Open Publication No. 2007-59567, using a shower plate of quartz with a thickness of 10 mm instead of a shower plate of silicon (Si) used for the etching of silicon insulating film. However, new problems arise with the plasma generation conditions of high bias, low power, and small gap distance of 50 mm or less required to etch dielectric film. One problem is that the uniformity if deteriorated because the etching rate in the end of the wafer is faster than in the center, and because the distribution has an M or W shape. Another problem is corrosion of the gas distribution plate in the portion without being coated by resin or ceramic splaying, and metal contamination of the object to be processed. The problems, such as the corrosion of the gas distribution plate or the metal contamination of the object to be processed, have been solved by using a gas distribution plate in which the surface of a base metal (for example, SUS316L) 201 is completely covered by polyimide resin 202 and alumina 203 as shown in FIG. 2. However, the uniformity improvement has not been confirmed.

Thus, the inventors studied the electrical property control circuit described in Japanese Patent Application Laid-Open Publication. No. 2011-82180. However, when the electrical property control circuit is used in CCP, the upper electrode is conductive in which metal contamination is likely to occur. In addition, it is difficult to control the in-plane distribution of plasma generation with a high frequency for the source, as well as the in-plane distribution of the sheath voltage on the wafer, independently. Thus, it would be difficult to equalize the ER distribution only by the electrical property control circuit.

Accordingly, it is desirable to provide a dry etching apparatus and method capable of highly uniform etching, even if a shower plate of quartz is used instead of silicon, in order to use corrosive gases such as fluorocarbon gas as well as halogen gas such as chlorine and HBr, in the dry etching apparatus such as parallel-plate type VHF plasma etching apparatus.

In one embodiment to achieve the object, there is provided a dry etching apparatus including: a placement unit which is located in a vacuum chamber capable of being evacuated and on which an object to be process is placed; an antenna electrode which is located opposite the placement unit and supplied with high frequency is supplied to ionize etching gas into a plasma introduced into the vacuum chamber; a high frequency supply unit connected to the antenna electrode to supply high frequency to the antenna electrode; an antenna electrode dielectric material provided on the plasma side of the antenna electrode to discharge the gas into the vacuum chamber; a pressure control unit for controlling the pressure of the gas introduced into the vacuum chamber; and an RF bias application unit for applying an RF bias to the placement unit. In the dry etching apparatus, a bias path controller (B.P.C) is provided on the side of the antenna electrode. The bias path controller resonates in series with the static reactance formed by the antenna electrode dielectric material with respect to the RF bias frequency. Then, the bias path controller (B.P.C) changes and grounds the impedance by the variable inductive reactance.

Further, there is provided a dry etching method including the steps of: placing an object to be processed on a stage; introducing etching gas into a vacuum chamber in which the stage is placed; controlling the pressure of the gas introduced into the vacuum chamber; supplying high frequency to the antenna located opposite the object to be processed to ionize the gas into a plasma; and applying an RF bias to the object to be processed. The dry etching method also includes an RF bias current ratio control step for controlling the ratio of the RF bias current flowing to the antenna electrode, and the RF bias current flowing to the side of the side wall of the vacuum chamber.

According to an aspect of the present invention, it is possible to provide a dry etching apparatus and method capable of highly uniform etching, even if a shower plate of quartz is used instead of silicon, in order to use corrosive gases such as fluorocarbon gas as well as halogen gas such as chlorine and HBr, in the dry etching apparatus such as the parallel-plate type VHF plasma etching apparatus.

BRIEF DESCRIPTION OF THE DRAWINGS

FIGS. 12A, 12B, and 12C are main circuit diagrams according to the third embodiment of the present invention, in which

DESCRIPTION OF THE PREFERRED EMBODIMENTS

The inventors discussed the reason why the etching uniformity is deteriorated when the material of the shower plate is changed from silicon to quartz. As a result, it was found that the bias can be applied to the shower plate of silicon but not to the shower plate of quartz, and as a result, the bias current flows to the side of the side wall of the plasma process chamber. Thus, the inventors further discussed a method that allows the bias current to flow to the side of the antenna electrode. As a result, it was found that the etching uniformity can be improved, by providing an bias path controller (B.P.C) on the side of the antenna electrode, and by controlling the flow rate of the bias current in the plasma to the antenna electrode and to the side wall of the plasma process chamber. The present invention was made based on the newly acquired knowledge.

Hereinafter the present invention will be described in detail through embodiments.

First Embodiment

Figure 1:
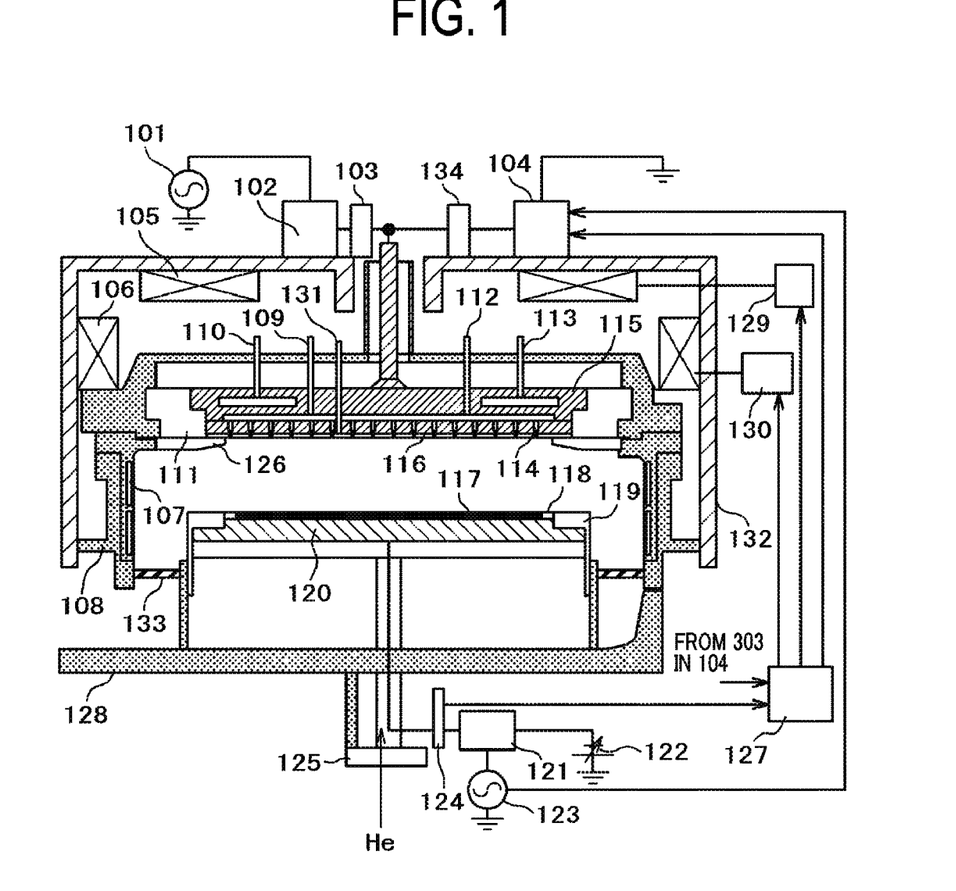
FIG. 1 is a schematic cross-sectional view of a dry etching apparatus according to a first embodiment of the present invention.

Dry etching apparatus according to a first embodiment of the present invention will be described with reference to FIGS. 1 to 7. FIG. 1 is a vertical cross-sectional view schematically showing the configuration of the dry etching apparatus according to the first embodiment. The dry etching apparatus is designed to form plasma within a plasma process chamber (etching chamber) that is disposed within a vacuum chamber, and to use this plasma to process a substrate sample, which is a material to be etched, such as a semiconductor wafer placed in the plasma process chamber.

In the dry etching apparatus, the vacuum chamber includes a plasma process chamber (etching chamber) 108, a grounded inner wall 107, a quartz top plate 111, an antenna electrode 115, a base frame 128, and a vacuum pump as well as a pressure control valve that are not shown in the figure. Reference numeral 133 denotes a shield.

A wafer (object to be processed) 117 with a layer of silicon oxide film, silicon nitride film, and Si (silicon) is the material to be etched. The wafer 117 is placed on a wafer stage 120. The wafer stage 120 includes a ring-shaped susceptor 119. The susceptor 119 is formed on the top of the wafer stage 120 to cover the peripheral side of the placement surface on which the Si wafer 117 is placed, and to cover the side wall of the wafer stage 120. Reference numeral 118 denotes a focus ring. Further, plurality of temperature control units and the like (not shown in FIG. 1) are provided to control a plurality of predetermined temperatures. During the etching process, a DC power supply 122 for electrostatic chuck (ESC) generates a DC voltage of −2000 V to +2000 V to electrostatically chuck the wafer 117 by applying the generated DC voltage. Then, the gap between the Si wafer 117 and the wafer stage 120 is filled with He, which has a high thermal efficiency, to control the He pressure on the back surface of the wafer. Reference numeral 125 denotes a lifting mechanism of the wafer stage 120.

Then, a radio frequency (RF) bias power supply 123 of 4 MHz, as well as an RF bias matching unit 121 are connected to the wafer stage 120, in order to draw ions into the wafer 117 from the plasma to control the ion energy. Reference numeral 124 denotes a radio frequency (RF) current detection unit.

For example, it is assumed that the object to be processed is silicon film, silicon nitride film, TiN film, resist film, antireflection film and the like. In this case, the output of the RF bias power supply 123 ranges from about 1 W up to about 2 kW (continuous sine wave) with respect to the object to be processed with 12 inch diameter.

Further, the dry etching apparatus used here has a time modulate (hereinafter, referred to as TM) function for on/off modulation in the range of 1 Hz to 10 kHz, in order to reduce charge-up damage (electron shading) and achieve vertical etching effect.

The gases for etching are introduced into the vacuum chamber from two lines of gas inlet ports A 109 and B 112 on the top of the antenna electrode 115, through a mass flow controller and a stop valve that are not shown in the figure. Then, the gases are distributed uniformly in a gas distribution plate 114 so that they are not mixed in the gas distribution plate 114. Then, the gases are introduced into the etching chamber 108 through two lines from the region of the shower plate 116 that is concentrically divided into two parts. Reference numeral 131 denotes an end point detector (EPD) window (hole part). The light passing through the EPD window is led to a spectroscope by an optical fiber, and the like. The etching end point can be detected by monitoring this light.

In the dry etching apparatus, the shower plate 116, the gas distribution plate 114, and the antenna electrode 115 are in close contact with their surfaces. The excessive temperature increase of the shower plate 116 is controlled by the temperature control of the antenna electrode 115. Reference numeral 110 denotes a coolant inlet port, and reference numeral 113 denotes a coolant outlet port. Similarly, the temperature of the grounded inner wall 107 coming into contact with plasma is controlled by the coolant flowing through it. Further, the shower plate 116 uses quartz which is corrosion resistant to gases such as $Cl_2$, HBr, $SF_6$, and $NF_3$.

The introduced gases are dissociated by the energy of the electromagnetic wave irradiated by a plasma generation unit. Thus, plasma is generated and sustained. The plasma generation unit of the dry etching apparatus shown in FIG. 1 includes a source power supply 101 with a VHF wave at 200 MHz, the antenna electrode connected to the source power supply 101 to generate an electric field, an electromagnet A 105 for generating a magnetic field, and an electromagnet B 106 (magnetic field generation unit). The plasma generation unit generates plasma by the electromagnetic interaction (electron cyclotron resonance). Thus, the magnetic field formed by the electromagnet A 105 and the electromagnet B 106 can output a magnetic flux density of 7.1 mT for electron cyclotron resonance at 200 MHz. Note that the magnetic field generation unit may be omitted as long as the plasma generation unit can generate plasma. However, with this magnetic field generation unit, it is possible to generate plasma at lower pressure.

The VHF wave oscillated from the source power supply 101 is introduced into the antenna electrode 115 located opposite the wafer stage 120 through a source electromagnetic field matching unit 102 and a high-pass filter 103. The VHF antenna (antenna electrode) 115 and the etching chamber 108 are electrically insulated by the quartz top plate 111 and a quartz ring 126. The high-pass filter 103 allows 200 MHz to pass through, and is high impedance at the high frequency of the RF bias.

In this embodiment, as the measures for corrosion protection, the metal of the area coming into contact with a gas pressure of 50 Pa or more, as well as the metal of the antenna electrode inside the vacuum chamber are not exposed to the outside. For example, FIG. 2 is a cross-sectional view around the hole for passing gas and the EPD window in the gas distribution plate 114 used in this embodiment. The base metal 201 is SUS316L. An alumina sleeve 203 is embedded in the hole for passing gas and in the hole for the quartz window. Then, the interface and the SUS surface are covered by polyimide resin. With this configuration, it is possible to maintain the function as the antenna for VHF waves and the function as the earth parts for the RF bias, while reducing the metal contamination from the contact surface between the SUS surface and the alumina sleeve. The material of the base metal 201 is not limited to SUS316L, and other conductive materials can also be used. Note that the corrosion protection is not necessarily required from the point of view of the uniformity improvement, and can be omitted by using anticorrosive conductive material as the base metal.

Further, the electromagnet A 105 is placed on the top of a coil yoke 132 to form a divergent magnetic field in the vacuum chamber. The electromagnet B 106 is placed on the side wall of the coil yoke 132 to form a magnetic field in the vertical direction. When the total ampere turn value of the electromagnet A 105 and the electromagnet B 106 is constant, the production efficiency in the antenna electrode surface of 200 MHz is constant. As a result, the same ion current distribution can be maintained. For example, it is assumed that the electromagnet A is used for HBr plasma at 8 Pa and source power of 400 W, with the number of coil turns equal to half the number of coil turns of the electromagnet B 106. In this case, the electromagnet A 105/electromagnet B 106 current values of 0/5 ampere and of 2/4 ampere are the same ion current distribution. Thus, by changing the ratio of the magnetic fields formed by the electromagnet A 105 and the electromagnet B 106, it is possible to change the magnetic field line direction to the wall surface as well as the magnetic field gradient, while keeping the ion current distribution constant. Reference numeral 129 denotes a DC power supply for the electromagnet A, and reference numeral 130 denotes a DC power supply for the electromagnet B. When a power supply capable of allowing bipolar current to flow is used for the DC power supplies of the electromagnets A and B, it is possible to form a wider range of magnetic field gradients such as −2/6A and 12/−1A.

On the other hand, with respect to the RF bias, the electron, which is the transmission medium of the RF bias, is constrained by the magnetic field line in a spiral by the Larmor frequency due to the presence of the magnetic field. Thus, the dielectric material is anisotropic. In other words, the dielectric material has a low impedance in the direction parallel to the magnetic field line, and has a high impedance in the direction perpendicular to the magnetic field line. In general, the stronger the magnetic field and smaller the plasma density, the greater the impedance is in the direction perpendicular to the magnetic field line. As a result, the maximum value of the impedance is as high as 4 to 8 MHz with respect to the frequency to be transmitted.

As described above, the shower plate 116 using quartz has an electrostatic capacitance that is one digit or more smaller than the electrostatic capacitance (about several n F) of the plasma sheath that is formed in the grounded inner wall 107 and on the shower plate 116. For this reason, the RF bias current flows to the side of the grounded inner wall 107 and not to the side of the antenna electrode 115. At this time, the RB bias current is also constrained by the magnetic field, so that non-uniformity of the RF bias is likely to occur on the wafer under conditions of small gap distance, high pressure, and high bias.

Thus, in this embodiment, there is provided a mechanism for grounding the high frequency of the RF bias by providing a bias path controller 104 on the side of the antenna electrode 115. The connection of such a circuit allows the RF bias to flow to the side of the opposite antenna electrode 115, even if the shower plate 116 of quartz with high impedance for protection against contamination and corrosion is present. This will be described below.

Figure 3:
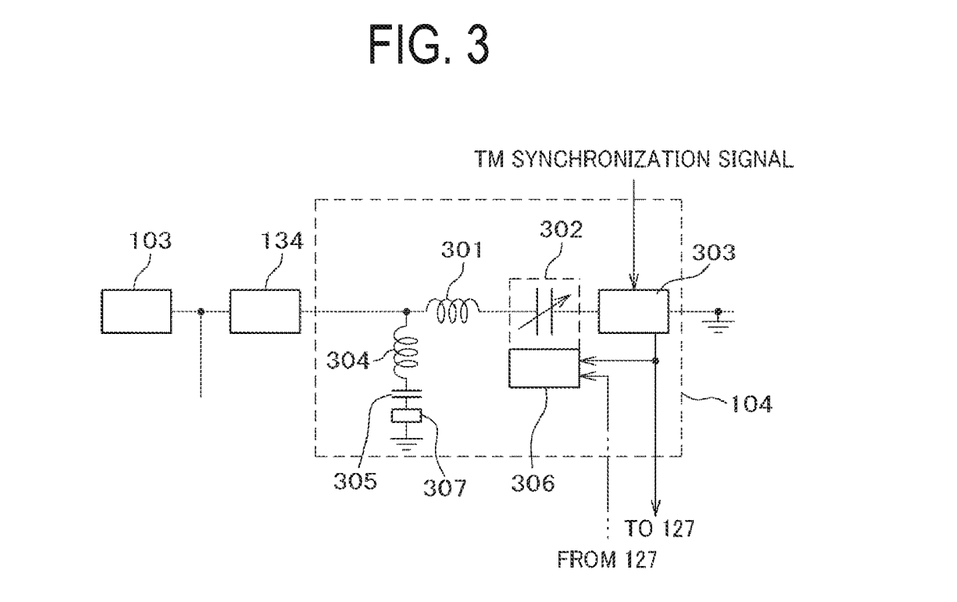
FIG. 3 is a schematic circuit diagram of a bias path controller in the dry etching apparatus according to the first embodiment of the present invention.

FIG. 3 is a diagram of the configuration of the B.P.C 104. The B.P.C 104 includes a serial resonance circuit and an antenna RF current detection unit 303. The serial resonance circuit includes a resonance coil 301 with a low resistance that can support the maximum current of the RF bias, and a variable capacitor 302. The low-pass filter 134 has a function to block 200 MHz for the source by a high impedance, while allowing 4 MHz of the RF bias to pass through by a low impedance. The resonance coil 301 and the variable capacitor 302 form a serial resonance circuit. The inductance (L) of the resonance coil 301 as well as the electrostatic capacitance ($C_v$) of the variable capacitor 302 are selected, by taking into account the capacitance ($C_{sp}$) of the quartz shower plate 116 as well as the capacitance ($C_{th}$) of the sheath formed on the shower plate 116.

By using the variable reactance of the variable capacitor 302 and the like, the grounding is possible through a low impedance, in the process of a plurality of steps necessary for multi-layer etching, according to the case in which the sheath capacitance ($C_{sh}$) formed on the shower plate is changed due to the factors such as gas type, pressure, and density of different plasmas, and according to the parasitic impedance generated by the actual circuit. In the design process, the variable reactance ($X_v$) of the variable capacitor, as well as the inductance (L) of the resonance coil 301 can be determined by the relationship of equation (1).

Equation 1

$$X_V = \omega L - \frac{1}{\omega}\left(\frac{1}{C_{Sh}} + \frac{1}{C_{sp}}\right) \quad (1)$$

Here, ω is the angular speed of the RF bias frequency. When the variable reactance element is the capacitor, $X_v$ is given by the relationship of equation (2), where $C_v$ is the capacitance of the capacitor. When the variable reactance element is the coil, $X_v$ is given by the relationship of equation (3), where $L_v$ is the inductance of the coil.

Equation 2

$$X_V = \frac{1}{\omega C_v} \quad (2)$$

Equation 3

$$X_V = \omega L_V \quad (3)$$

The B.P.C 104 can have an automatic matching function so that the current of the antenna RF current detection circuit 303 can be the maximum. In this case, it is possible to achieve productive and stable etching process for etching a multilayer film.

In the antenna RF current detection unit 303, the monitoring of the on-time peak current value is virtually continued during the off time, in synchronization with the timing signal of on-off pulse from the RF bias power supply 123 with TM function. Then, the monitored current values are output to an automatic matching unit 306 and to a bias distribution control circuit 127. With this function, it is possible to equalize the variation of the current monitor value which is zero during the off time, similarly to the case of using continuous bias. Thus, it is possible to constantly operate the B.P.C and the bias distribution control circuit 127, even in the application of TM bias. At tens time, the signal from the bias distribution control circuit 127, which is determined including the monitored value of all the bias currents, may be used as the control reference signal of the automatic matching unit 306.

Further, a plurality of sets of harmonic short-circuited coils 304 and harmonic short-circuited fine adjustment capacitors 305 are inserted parallel to the resonance coil 301 and the variable capacitor 302, according to the harmonic order. This makes it possible to achieve low impedance with respect to a plurality of harmonics generated when passing through the plasma sheath on the antenna electrode 115. As a result, the RE bias can be uniform under a wider range of plasma conditions. In addition, by monitoring the current values of a plurality of harmonics by a harmonic current detection circuit 307, it is possible to obtain the information of the plasma density and the electron temperature, and detect the change in the state of the apparatus more accurately. Further, the same effect can be achieved by using not only the circuit shown in FIG. 3, but also a circuit including a low-pass filter circuit having a cutoff frequency that blocks the source frequency while allowing the bias frequency and the fifth harmony to pass through, as well as a bias current detection circuit, and the like.

Figure 4:
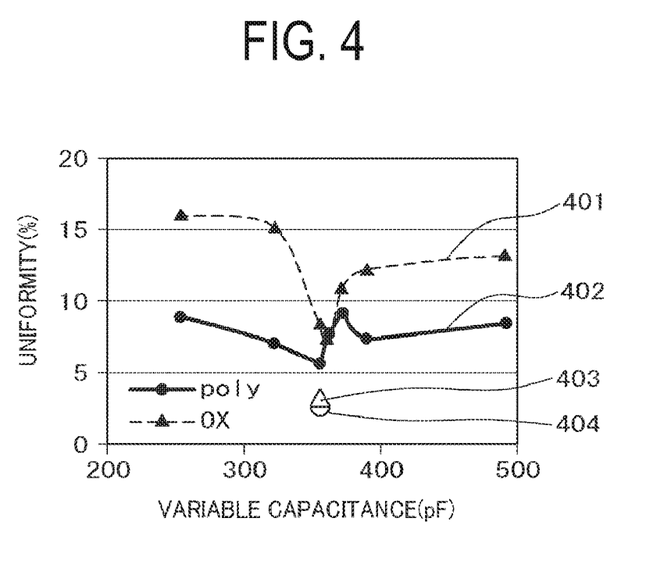
FIG. 4 is a graph showing the change in the ER uniformity when the variable capacitance of the bias path controller is changed in the dry etching apparatus according to the first embodiment of the present invention.
Figure 5:
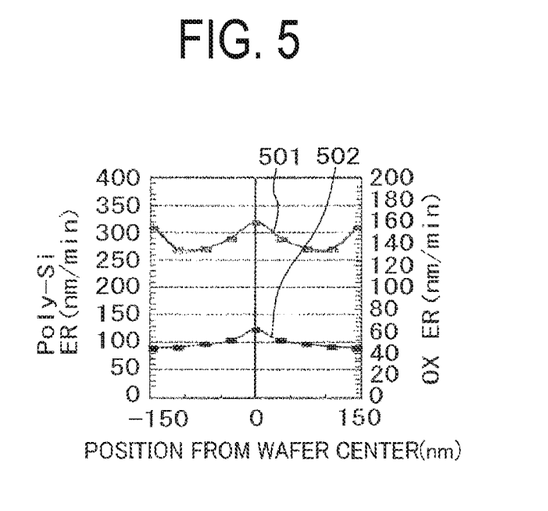
FIG. 5 is a graph showing the in-plane distribution of the ER when the bias path controller is not operated in the dry etching apparatus according to the first embodiment of the present invention.
Figure 6:
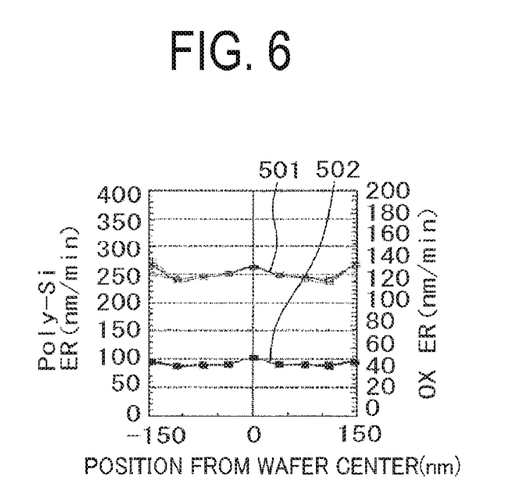
FIG. 6 is a graph showing the in-plane distribution of the ER when the bias path controller is used in the dry etching apparatus according to the first embodiment of the present invention.
Figure 7:
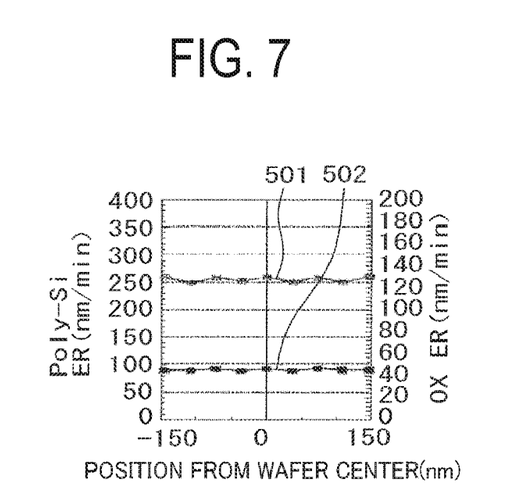
FIG. 7 is a graph showing the in-plane distribution of the ER when the bias path controller is used and the electric field adjustment is performed in the dry etching apparatus according to the first embodiment of the present invention.

FIG. 4 is the graph and in-plane distribution showing the change in the uniformity of poly-Si and oxide film (OX) when the capacitance of the variable capacitor 302 is changed. The uniformity is the minimum at the point where the current value is the maximum. Reference numeral 401 denotes the variable capacitance dependence of the ER uniformity of poly-Si. Reference numeral 402 denotes the variable capacitance dependence of the ER uniformity of the oxide film. Reference numeral 403 denotes the ER uniformity of poly-Si after the adjustment of the magnetic field. Reference numeral 404 denotes the ER uniformity of the oxide film after adjustment of the magnetic field. When not resonant, the RE bias is directed only to the side of the chamber inner wall along the magnetic field line. Thus, the ER is likely to increase in the edge of the wafer as shown in FIG. 5. Reference numeral 501 denotes the plane distribution of the ER of poly-Si. Reference numeral 502 denotes the in-plane distribution of the ER of oxide film. However, when the resonance point is used, the impedance on the side of the opposite antenna electrode 115 decreases, so that the current flows in the same way as that flowing to the chamber inner wall. In other words, the flow rate of the bias current in the plasma to the antenna electrode and to the wall surface of the plasma process chamber changes, resulting in the distribution in which the ER is less likely to increase in the edge of the wafer as shown in FIG. 6. Further, when the current proportion of the electromagnet A 105 is increased at the resonance point, the ER uniformity of poly-Si and the ER uniformity of the oxide film can be improved to 2.5% and 3.0%, respectively.

As described above, in the etching apparatus of the parallel plate structure having the corrosion-resistant shower plate (for example, the magnetic VHF plasma etching apparatus according to the first embodiment, capacitively coupling plasma etching apparatus, and the like), it is possible to improve the etching uniformity by directing the RF bias from the wafer stage 120 to the antenna electrode 115 in the vertical direction, by the B.P.C 104 provided in the antenna electrode 115.

Further, in the effective field VHF plasma, the electromagnet A 105 and the electromagnet B 106 are provided to control the current ratio to adjust the direction of the magnetic field lines. In this way, it is possible to control the in-plane distribution of the wafer sheath voltage generated by the RF bias, independent of the ion flux distribution on the wafer. As a result, uniform ER and etching profile can be achieved even under conditions of small gap distance, high pressure, and high bias. In particular, when the area of the wall surface earth is small in which the gap distance is 50 mm or less and the ratio of the etching chamber radius and the gap distance is 5 or more, a uniform bias distribution can be obtained.

In the above embodiment, the RF frequency of 4 MHz is used. However, for example, when a higher frequency of 13.56 MHz is used, it is possible to reduce the impedance of the quartz shower plate to about one third, and to reduce the size of the resonance coil 301. The full width at half maximum (the so-called Q value) is broadened with respect to the resonance frequency, thus allowing it to be more stable with respect to the plasma state. In addition, the etching performance can also be improved by using the high frequency to narrow the bandwidth of the ion energy distribution, thus achieving a highly selective process. In this case, the low-pass filter 134 and the high-pass filter 103 are replaced by those for 13.56 MHz. Further, the inductance of the resonance coil 301 and the capacitance of the variable capacitor 302 in the B.P.C 104 are also changed to those for 13.56 MHz. It is preferable to set the maximum frequency to be one tenth of the frequency of the plasma source supply, or less, from the point of view of the cutoff frequency of the low-pass filter 134, which is the same as the case of using a higher frequency RF bias. Further, it is preferable to set the minimum frequency to a value so that the impedance of the shower plate 116 is 100 ohms or less, for example, to 2 MHz or more with the quartz width of 4 mm.

Similarly, the impedance of the shower plate can also be reduced by reducing the thickness or by changing the dielectric constant. For example, a material with high dielectric constant and high plasma resistance (yttria, alumina, sapphire glass, and the like) may be used instead of quartz for the shower plate for contamination control. Further, it is preferable to have a thickness that allows the shower plate to withstand the stress from the pressure difference and allows the VHF wave to propagate to the center. For example, the thickness is preferably 3 mm or more in the case of quartz with a dielectric constant of 3.5.

In this embodiment, the current flowing to the B.P.C 104 is detected by the antenna RF current detection circuit 303 and the harmonic current detection circuit 307, to serve as the basis for the selection of the optimal value of automatic matching or variable capacitance. However, it is also possible to monitor by the individual components (the resonance coil 301, the variable capacitor 302) of the B.P.C 104, the voltage applied to the two components, the phase difference between the current and the voltage, or the impedance. Further, it is also possible to fix the value of the variable reactance to achieve appropriate uniformity not only through automatic matching but also through etching recipe.

As described above, according to this embodiment, it is possible to provide a dry etching apparatus capable of highly uniform etching by providing a B.P.C, even if a shower plate of quartz is used instead of silicon, in order to use corrosive gases such as fluorocarbon gas as well as halogen gas such as chlorine and HBr, in the dry etching apparatus such as the parallel-plate type VHF plasma etching apparatus. Further, the uniformity can be further improved with effective magnetic field. In addition, metal contamination or other problems can be suppressed or prevented by using the gas distribution plate with the surface of the conductive base metal being covered by resin or ceramic.

Second Embodiment

A dry etching method according to a second embodiment of the present invention will be described with reference to FIGS. 8 and 9. Note that the items described in the first embodiment, but not described in the second embodiment, can also be applied to the second embodiment unless special circumstances exist. In this embodiment, there is described a method for reproducibly stabilizing the profile uniformity in the process of the multilayer film in the dry etching apparatus described in the first embodiment.

Figure 8:
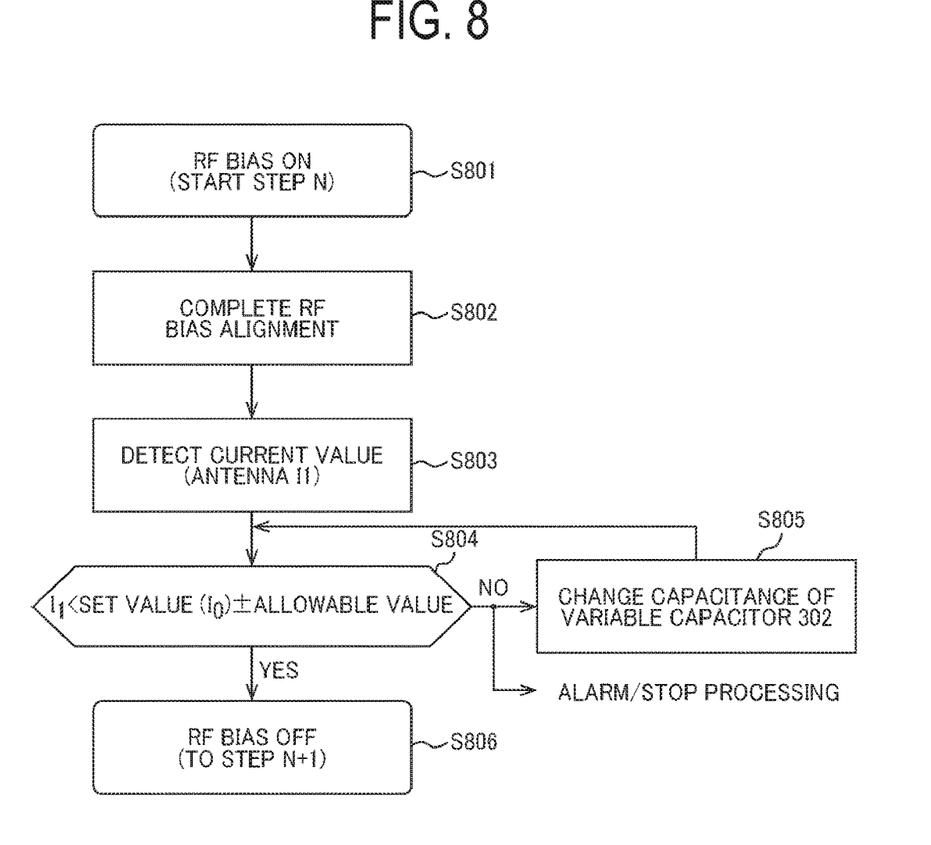
FIG. 8 is a flow chart of the main procedure of a dry etching method (control method of the bias path controller for multi-layer etching) according to a second embodiment of the present invention.

FIG. 8 is a flow chart of a method of etching using the B.P.C 104 shown in FIG. 3, including a plurality of steps in which the gas type, source power, RF bias power, and the like, are different. In the Nth step of the etching process, a radio frequency (RF) bias is applied (S801). When the automatic matching of the RF bias completed (S802), the method detects the current $I_1$ of the antenna by the antenna RF current detection circuit 303 (S803). Next, the method determines whether the detected is the maximum or in the range of values of the predetermined set value $(I_0)\pm$the allowable value (S804). If the determination is Yes, the RF bias is OFF (S806). If the determination is No, the method applies automatic matching to the variable capacitorce (S805). In this way, the method adjusts the impedance on the antenna side by repeating the steps S804 and S805 so as to achieve the optimal value for the homogeneous conditions in N steps. At this time, the method adjusts the current on the antenna side when $I_1$ is out of the allowable value range. However, when it is difficult to adjust within a predetermined time period, the method issues a warning and stops the process. When the RE bias is OFF, the method moves to the next N+1th step to perform the same operation based on the value that is set separately.

Next, the procedure of the dry etching method using the apparatus shown in FIG. 1 will be described with reference to the flow of FIG. 8. First, the method places the object to be processed 117 on the wafer stage 120. Next, the method introduces etching gas into the vacuum chamber in which the wafer stage 120 on which the object to be process 117 is placed is disposed, to control the pressure of the gas. Next, the method supplies high frequency to the antenna electrode 115 facing the object to be processed 117 to ionize the gas into a plasma. At the same time, the method adjusts the plasma distribution by the electromagnets 105 and 106, and applies an RF bias to the object to be processed 117. Then, the method changes and grounds the impedance with respect to the RF bias frequency by the bias path controller (B.P.C) 104 that is located on the side of the antenna electrode. Then, the methods detects the current flowing to the antenna electrode, and adjusts the bias path controller (B.P.C) 104 so that the change in the detected current is within the allowable change value during plasma processing.

As a result of etching the object to be processed including polycrystalline silicon film by the method described above, highly uniform etching can be achieved.

Figure 9:
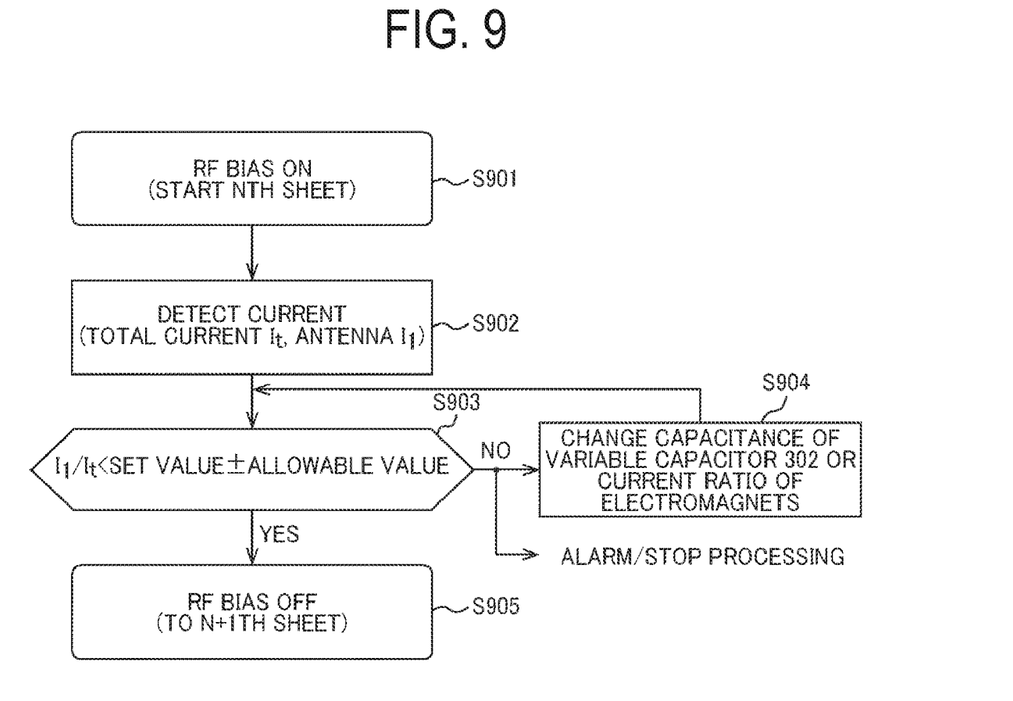
FIG. 9 is a flow chart of another main procedure of the dry etching method (control method of the bias path controller in N th wafer etching process) according to the second embodiment of the present invention.

FIG. 9 is a flow chart for processing N th wafer by monitoring the total current value ($I_t$) of 4 MHz that is detected by the RF current detection unit 124 and is supplied from the wafer side, in addition to the current of the antenna electrode ($I_1$). A radio frequency (RF) bias is applied (S901). Then, the method detects the total current value $I_t$ and the antenna current $I_1$ (S902). The values are input to the bias distribution control circuit 127 according to the number of wafers to be processed. Then, the method determines whether each of the values or the ratio of the values ($I_1/I_t$) is the predetermined set value or within the allowable value for the average value N−1 (S903).

If the determination is Yes, the RF bias is OFF (S905). On the other hand, if the determination is No, the method outputs a process warning signal to stop the process. Alternatively, the method adjusts the capacitance of the variable capacitor 302, or adjusts the current ratio of the DC power supply 129 for the electromagnet A and the DC power supply 130 for the electromagnet B, and the like, so that the ratio of the total current value of the RF current detection unit 124 to the antenna current value of the antenna RF current detection circuit is constant within the allowable value (S904). The method has the function of repeating the steps S903 and S904 in order to correct the change of the impedance due to the worn-out shower plate or other defects (because the bias current is likely to flow to the wall side when the thickness is reduced). Thus, it is possible to reproducibly stabilize the state of high uniformity.

Next, the procedure of the dry etching method using the apparatus shown in FIG. 1 will be described with reference to the flow of FIG. 9. First, the method places the object to be processed 117 on the wafer stage 120. Next, the method introduces etching gas into the vacuum chamber in which the wafer stage 120 on which the object to be processed 117 is placed is disposed, to control the pressure of the gas. Next, the method supplies high frequency to the electrode 115 facing the object to be processed 117 to ionize the gas into a plasma. At the same time, the method adjusts the plasma distribution by the electromagnets 105 and 106, and applies an RF bias to the object to be processed 117. Then, the method changes and grounds the impedance with respect to the RF bias frequency by the bias path controller (B.P.C) 104 that is located on the side of the antenna electrode. Then, method detects the total current of the RF bias as well as the current flowing to the antenna electrode. In this way, the method adjusts at least one of the ratios of the currents to the bias path controller 104 and the plurality of electromagnets 105 and 106, so that the change in the current is within the allowable value during plasma processing.

As a result of etching the object to be processed including polycrystalline silicon film by the method described above, highly uniform etching can be achieved.

Note that, as for the distribution adjustment knob, in addition to the parameter for mainly changing the plasma and the bias distribution, it is also possible to select parameters that are sensitive to the state of the object to be etched, such as the power of the sheath power supply, the source gas introduction rate, and the in-plane distribution on the wafer stage.

In addition to the method of the so-called active feedback described above, when a plurality of magnetic VHF plasma etching apparatus of the same type are shipped and launched, it is possible to correct the difference in the uniformity of the apparatus, by finely adjusting the center value of the variable capacitor by using the additional fixed capacitance so that the ratio between the predetermined set value $I_0$ to the antenna current $I_1$, $I_1/I_0$, is within the allowable value.

As described above, according to this embodiment, it is possible to provide a method for achieving highly uniform etching, even if the shower plate of quartz is used instead of a silicon in order to use corrosive gases such as fluorocarbon gas as well as halogen gas such as chlorine and HBr, in the dry etching apparatus such as the parallel-plate type VHF plasma etching apparatus, by detecting the current of the antenna and by adjusting the B.P.C based on the detected antenna current. Further, it is possible to reproducibly stabilize the state of high uniformity by detecting the total bias current as well as the current of the antenna, and by adjusting the capacitance of the B.P.C or the current ratio of the electromagnets based on the detected total bias current and the antenna current.

Third Embodiment

Figure 10:
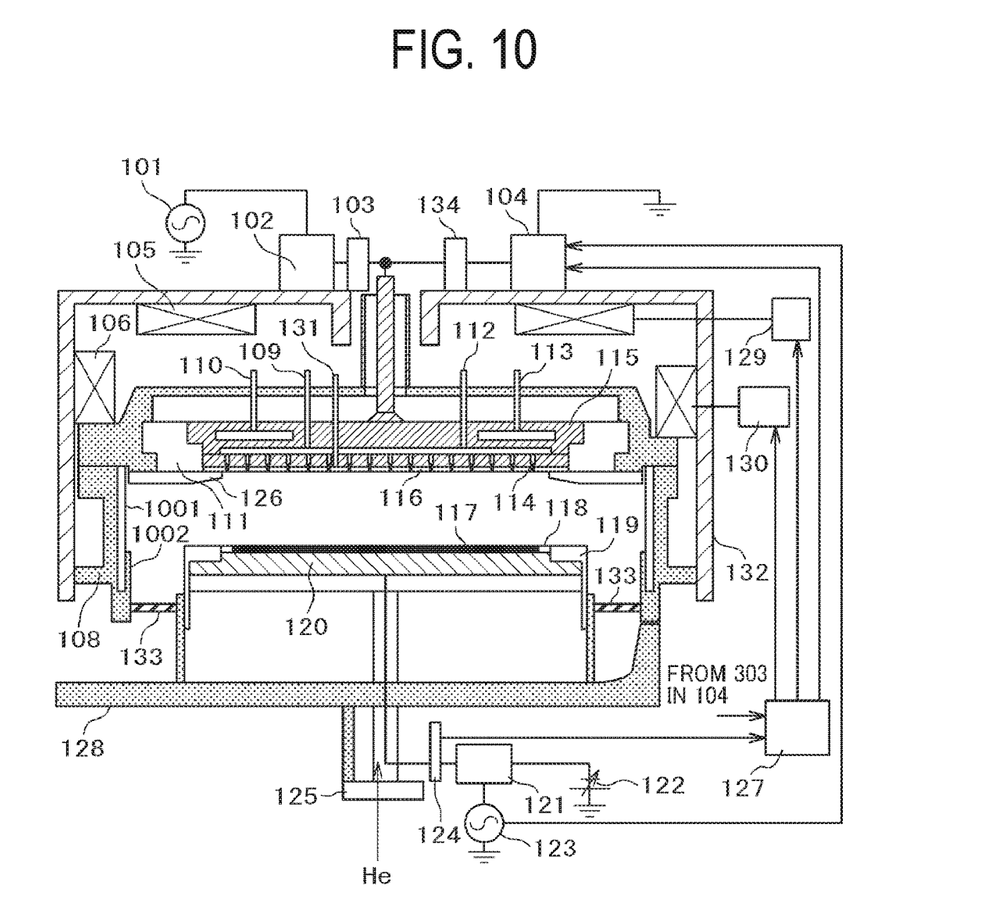
FIG. 10 is a schematic cross-sectional view of a dry etching apparatus (dry etching apparatus that effectively reduces the ratio of the bias current flowing to the inner wall) according to a third embodiment of the present invention.

A third embodiment of the present invention will be described with reference to FIGS. 10 to 12. Note that the items described in the first or second embodiment, but not described in the third embodiment, can also be applied to the third embodiment unless special circumstances exist. FIG. 10 is a schematic cross-sectional view of the dry etching apparatus according to the third embodiment. FIG. 10 shows an example in which the ratio of the bias current directed to the inner wall is reduced more effectively, when the area of the inner wall that the plasma contacts is increased (for example, the gap distance between the antenna electrode and the wafer stage is 50 mm or more). In the dry etching apparatus shown in FIG. 10, an inner wall 1001 of insulating quartz is provided instead of the grounded inner wall 107 inside the etching chamber 108 of the dry etching apparatus shown in FIG. 1. Then, a folded earth part 1002 is provided in the etching chamber 108. With this configuration, the ratio of the bias current to the inner wall can be further reduced and suppressed by appropriately adjusting the length of the folded earth part, under conditions of high gap with magnetic fields. In other words, it is possible to increase the ratio of the bias current flowing to the antenna electrode. In this case also, the appropriate uniformity can be obtained for the process conditions by changing the current ratio of the electromagnet A 105 and the electromagnet B 106.

Figure 11:
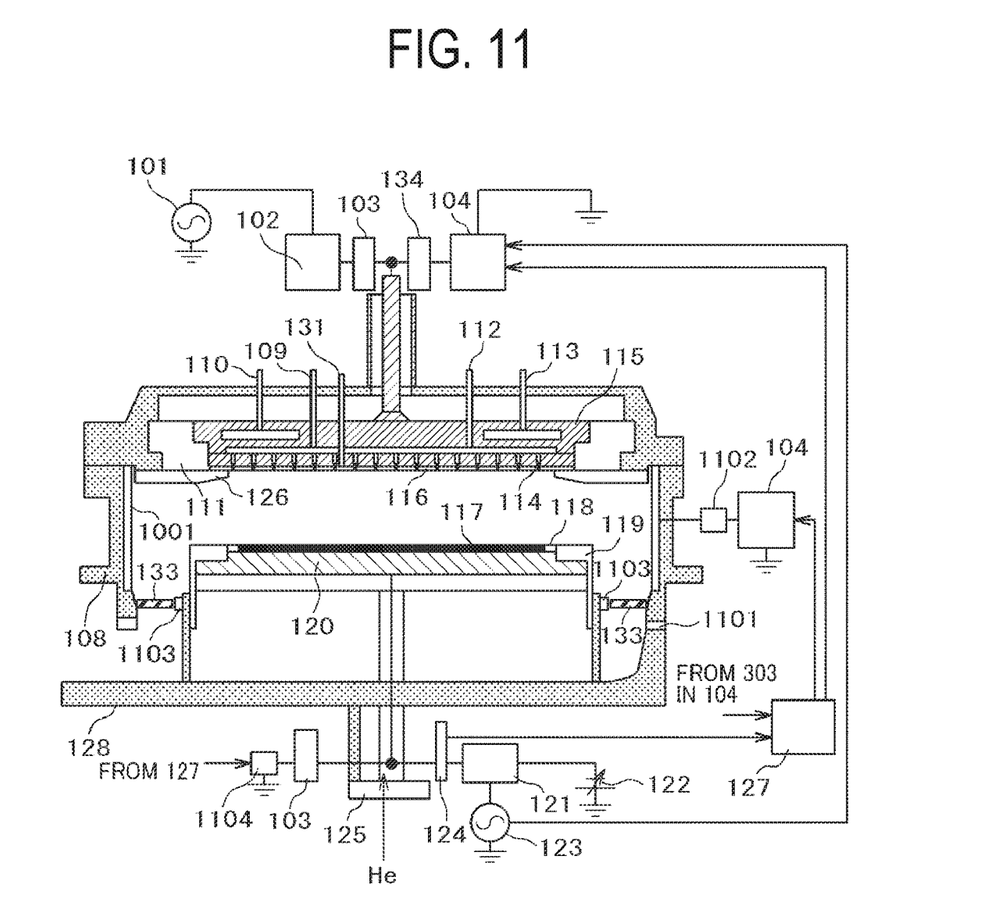
FIG. 11 is a schematic cross-sectional view of another dry etching apparatus (without electromagnets or permanent magnet) according to the third embodiment of the present invention.

Next, an example in which the distribution adjustment may not be provided by the magnetic fields, such as electromagnets A and B, will be described with reference to FIG. 11. FIG. 11 is a schematic cross-sectional view of the dry etching apparatus in which the electromagnets are not provided. The shield 133 and the etching chamber 108 are insulated from the base frame 128 by an insulating ring A 1101 and an insulating ring B 1103. Then, a source frequency grounding circuit 1102 and the B.P.C 104 are provided in the etching chamber 108. Further, the high-pass filter 103 and a source frequency variable grounding mechanism 1104 are provided on the side of the wafer stage. The source frequency grounding circuit 1102 is designed to ground with respect to the source frequency and allow the bias frequency to pass through. The source frequency variable grounding mechanism 1104 is designed to adjust and ground the reactance with respect to the source frequency.

Figure 12A:
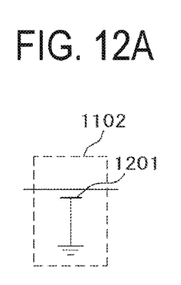
FIG. 12A shows a source frequency grounding circuit.
Figure 12B:
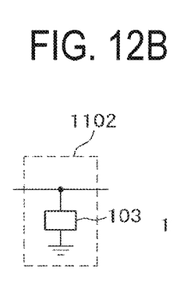
FIG. 12B shows another source frequency grounding circuit.
Figure 12C:
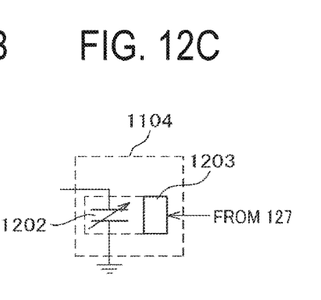
FIG. 12C shows a source frequency variable grounding mechanism.

Specific examples of the source frequency grounding circuit 1102 are shown in FIGS. 12A, 12B, and 12C. FIG. 12A shows a circuit for grounding through a feed-through capacitor 1201 with an appropriate capacitance. FIG. 12B shows a circuit for grounding through the high-pass filter 103. Further, as shown in FIG. 12C, the source frequency variable grounding mechanism 1104 includes a variable capacitor 1202 with a capacitance that allows the source frequency to pass through. In FIG. 11, the control may also be provided by the source frequency variable grounding mechanism 1104 including a reactance variable unit 1203, replacing the source frequency grounding circuit 1102. The source frequency grounding circuits 1102 can be applied not only to the dry etching apparatus with no electromagnets as shown in FIG. 11, but also to the case of FIG. 1 and FIG. 10 in which the magnetic fields are used.

In the dry etching apparatus shown in FIG. 11, the uniformity of the bias is controlled by adjusting the variable capacitor 302 in the B.P.C 104 that is grounded to the antenna electrode 115 and to the etching chamber 108, respectively. Further, the plasma uniformity is controlled by adjusting the value of the source frequency variable capacitor 1202 with respect to the wafer stage 120 and the etching chamber 108, respectively. The control of the ER and profile uniformity can be achieved by the apparatus including the mechanism described above. It is also possible to control the uniformity of the bias, even if the magnetic fields exist, by grounding the B.P.C 104 also to the side of the etching chamber 108 and by changing the impedance to the side of the grounded inner wall. In this case, a wider range of uniformity control and stability can be achieved. In addition, even if the dry etching apparatus has no magnets, it is possible to improve the stability of plasma ignition at low pressure as well as the in-plane selectivity, by controlling the flow rate of the bias current in the plasma to the antenna electrode and to the wall surface of the plasma process chamber.

According to this embodiment, the same effect as that of the first and second embodiments can be obtained. Further, with the quartz (insulating) inner wall, it is possible to obtain high uniformity even if the gap distance is large. Further, when the dry etching apparatus does not have the electromagnets, downsizing and simplification of the apparatus can be achieved. In addition, with the B.P.C provided both on the antenna electrode side and on the etching chamber side, a wider range of uniformity stability can be achieved.

It is to be understood that the present invention is not limited to the exemplary embodiments and may include various modifications and alternative forms. For example, as noted previously, the forgoing descriptions of the embodiments are presented for purposes of illustration and description. They are not intended to be exhaustive or to limit the invention to the precise forms disclosed. Further, a part of the configuration of one embodiment can be replaced by the configuration of the other embodiments, or the configuration of one embodiment can be added to the configuration of other embodiments. Further, addition, deletion, or replacement of other configurations is allowed for a part of the configuration of each embodiment.

What is claimed is:

1. A dry etching method comprising steps of:
   placing a wafer on an upper surface of a wafer stage in a vacuum chamber which is evacuated;
   introducing gas into the vacuum chamber;
   supplying a first radio frequency power to an antenna electrode disposed opposite to the upper surface of the wafer stage to ionize the gas into a plasma;
   applying a second radio frequency power which is repeatedly on and off in a predetermined time period to the wafer stage to make RF bias on the wafer for processing the wafer, the method further comprising steps of:
   adjusting an impedance of the antenna electrode to a ground with respect to the second radio frequency power based on an output of a current detection for a current of the second radio frequency power during the processing of the wafer by a current detection unit so that the output of the current detection for the current of the second radio frequency power in on-time thereof by the current detection unit is equal to a predetermined value, wherein the current of the second radio frequency power flows through the antenna electrode to the ground and the current detection unit outputs the predetermined value for the current of the second radio frequency power in on-time thereof and maintains the predetermined value as the output of the current detection for the current of the second radio frequency power in off-time of the second radio frequency power, and
   wherein the step of adjusting the impedance of the antenna electrode to the ground includes a step of adjusting a reactance of a resonance circuit which is disposed between the antenna electrode and the ground and is resonated in series with a static resonance with respect to the second radio frequency power of an antenna electrode dielectric material located on the plasma side of the antenna electrode.

2. The dry etching method according to claim 1,
   the dry etching method further comprising a step of adjusting a ratio of the current of the second radio frequency power flowing through the antenna electrode to the ground and the current of the second radio frequency power flowing through a side wall of the vacuum chamber to the ground.

3. The dry etching method according to claim 2,
   wherein the step of adjusting the ratio of the currents the second radio frequency power flowing through the antenna electrode and the side wall of the vacuum chamber to the ground includes adjusting the impedance between the side wall and the ground.

* * * * *